United States Patent
Roohparvar

(10) Patent No.: US 6,865,111 B2
(45) Date of Patent: Mar. 8, 2005

(54) METHOD AND ARCHITECTURE TO CALIBRATE READ OPERATIONS IN SYNCHRONOUS FLASH MEMORY

(75) Inventor: Frankie F. Roohparvar, Milpitas, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/788,862

(22) Filed: Feb. 27, 2004

(65) Prior Publication Data
US 2004/0165444 A1 Aug. 26, 2004

Related U.S. Application Data

(62) Division of application No. 10/017,892, filed on Dec. 12, 2001.

(51) Int. Cl.[7] .............................................. G11C 16/06
(52) U.S. Cl. .......................... 365/185.22; 365/185.21; 365/185.24; 365/189.07; 365/201
(58) Field of Search ........................ 365/185.22, 185.24, 365/185.33, 189.07, 201

(56) References Cited

U.S. PATENT DOCUMENTS

| | | | |
|---|---|---|---|
| 5,696,917 A | 12/1997 | Mills et al. | |
| 5,847,994 A | 12/1998 | Motoshima et al. | |
| 6,026,465 A | 2/2000 | Mills et al. | |
| 6,104,667 A | 8/2000 | Akaogi | |
| 6,104,668 A | 8/2000 | Lee et al. | |
| 6,185,128 B1 * | 2/2001 | Chen et al. | 365/185.11 |
| 6,208,564 B1 | 3/2001 | Yamada et al. | |
| 6,246,609 B1 | 6/2001 | Akaogi | |
| 6,246,626 B1 | 6/2001 | Roohparvar | |
| 6,266,282 B1 | 7/2001 | Hwang et al. | |
| 6,275,446 B1 | 8/2001 | Abedifard | |
| 6,278,654 B1 | 8/2001 | Roohparvar | |
| 6,304,488 B1 | 10/2001 | Abedifard et al. | |
| 6,304,497 B1 | 10/2001 | Roohparvar | |
| 6,304,510 B1 | 10/2001 | Nobunaga et al. | |
| 6,307,779 B1 | 10/2001 | Roohparvar | |
| 6,307,790 B1 | 10/2001 | Roohparvar et al. | |
| 6,314,049 B1 | 11/2001 | Roohparvar | |
| 6,377,502 B1 * | 4/2002 | Honda et al. | 365/230.03 |
| 6,515,900 B2 | 2/2003 | Kato et al. | |
| 6,552,934 B2 * | 4/2003 | Roohparvar | 365/185.18 |

* cited by examiner

*Primary Examiner*—Connie C. Yoha
(74) *Attorney, Agent, or Firm*—Leffert Jay & Polglaze, P.A.

(57) ABSTRACT

Architecture to calibrate read operations in non-volatile memory devices. In one embodiment, a synchronous flash memory is disclosed. The synchronous flash memory includes a read sense amplifier, a verification sense amplifier, a switch, and an output buffer. The switch alternates electrical connection of the output buffer with the read sense amplifier and the verification sense amplifier. By measuring the distributions of voltage thresholds of erased cells versus voltage thresholds of programmed cells, differences in offsets between read state and write state of memory cells are determined. A specific margin is determined to ensure proper reads of the memory cells.

14 Claims, 8 Drawing Sheets

METHOD AND ARCHITECTURE TO CALIBRATE READ OPERATIONS IN SYNCHRONOUS FLASH MEMORY

RELATED APPLICATION

This is a divisional application of U.S. patent application Ser. No. 10/017,892, filed Dec. 12, 2001, titled "METHOD AND ARCHITECTURE TO CALIBRATE READ OPERATIONS IN SYNCHRONOUS FLASH MEMORY" and commonly assigned, the entire contents of which are incorporated herein by reference.

TECHNICAL FIELD OF THE INVENTION

The present invention relates generally to non-volatile memory devices and in particular, to the calibration of read and write operations of synchronous flash memory devices.

BACKGROUND OF THE INVENTION

Memory devices are typically utilized as internal storage areas in integrated circuit devices. There are several different types of memory. One type of memory is random access memory (RAM). RAM has traditionally been used as main memory in a computer environment. A related memory is synchronous DRAM (SDRAM), which uses a clock pulse to synchronize the transfer of data signals throughout the memory to increase the speed of the memory.

By contrast, read-only memory (ROM) devices permit only the reading of data. Unlike RAM, ROM cannot be written to. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

A synchronous flash memory has the ability to read several thousand cells at a time, as contrasted to 16 cells at a time in a typical standard flash device. High read speeds of less than 10 nanoseconds are possible with synchronous flash devices, making the devices comparable in speed to SDRAM. But unlike SDRAM, synchronous flash has a slow write speed, typically about 10 microseconds. The slow write speed of synchronous flash is due primarily to the high voltage transistors used in the write path. The high voltage transistors tend to be large, which adds capacitance to the path. This capacitance significantly slows the read process.

For the reasons stated above, and for other reasons stated below which will become apparent to those skilled in the art upon reading and understanding the present specification, there is a need in the art for a non-volatile memory device to increase operating performance while maintaining proper operation.

SUMMARY OF THE INVENTION

The above-mentioned problems with non-volatile memory devices and other problems are addressed by embodiments of the present invention, and will be understood by reading and studying the following specification.

In one embodiment, a synchronous flash memory is disclosed. The synchronous flash memory includes a read sense amplifier, a verification sense amplifier, a switch, and an output buffer. The switch alternates electrical connection of the output buffer with the read sense amplifier and the verification sense amplifier. By measuring the distributions of voltage thresholds of erased cells versus voltage thresholds of programmed cells, differences in characteristics (offsets) between read state and write state of memory cells are determined. Thus, for a given sensing circuit, a specific margin is determined to ensure proper reads of the memory cells.

DETAILED DESCRIPTION OF THE INVENTION

In the following detailed description of present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Figure 1:
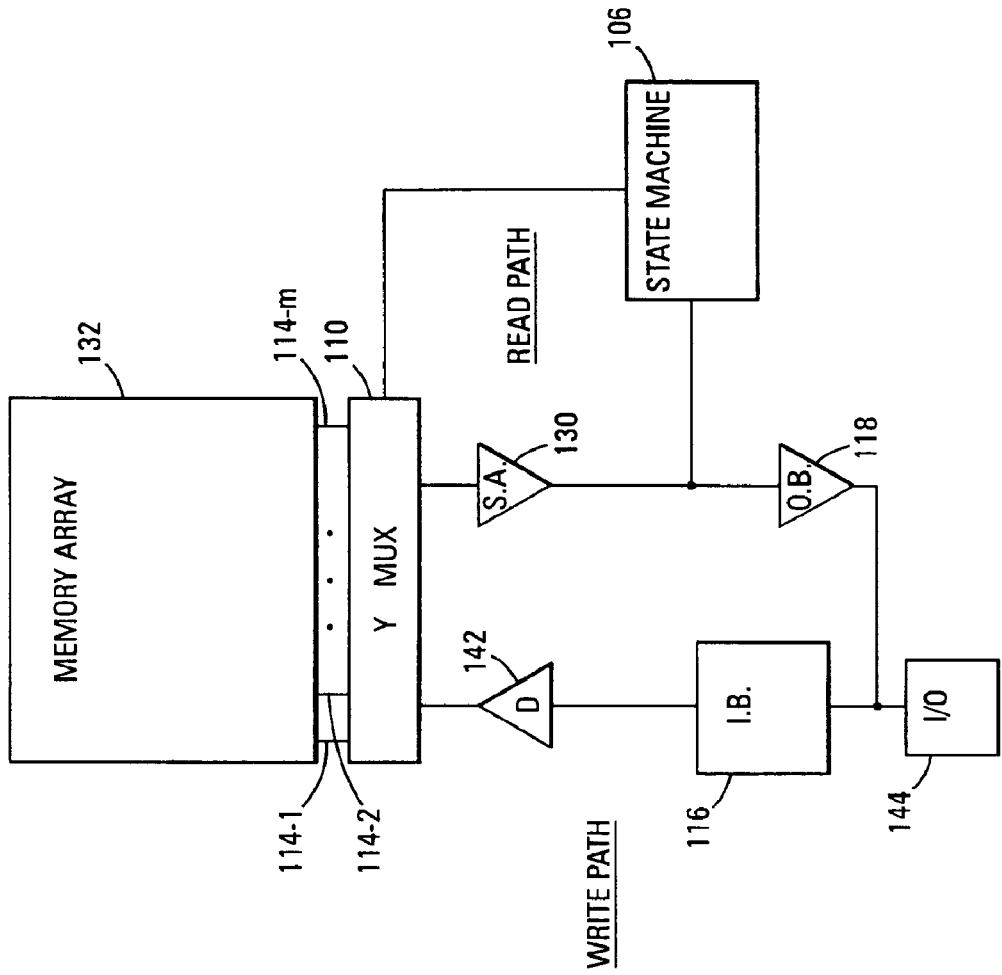
FIG. 1 is a block diagram illustrating the read and write paths of the prior art.

Referring to FIG. 1, a simplified block diagram illustrating a prior art read and write path of flash memory is shown. As shown, the read and write paths are coupled to memory array 132 by Y multiplexer (Y mux) 110. The write path receives data from an input/output (I/O) connection 144. The write path includes an input buffer (IB) 116 and a driver circuit (D) 142. The driver circuit 142 is used to increase the voltage level applied to bit lines 114-1 to 114-m coupled to cells within the memory array 132. For example, a 3 volt signal from the input/output connection 144 is increased by the driver circuit 142 to approximately 5.5 volts. The 5.5 volts is then applied to a drain of a respective cell in the memory array 132 when a voltage of approximately 10 volts is applied to the gate of the memory cell to program the memory cell. The Y mux 110 is coupled between the driver circuit 142 and the memory array 132 to selectively couple the program voltage, i.e. the 5.5 volts, to an addressed cell. The Y mux 110 is also shown coupled to a state machine 106. The state machine controls memory operations. In particular, the state machine 106 is coupled to control the operations of the Y mux 110. That is, to direct the Y mux 110 to select a specific bit line.

The read path includes a sense amplifier (SA) circuit 130 coupled to receive data from the Y mux 110 and an output buffer 118. The sense amplifier circuit 130 comprises a plurality of sense amplifiers that are used to read the cells in the memory array 132. As stated above, a typical sense amplifier circuit 130 may include 16 sense amplifiers. Generally, in order to select a given line, the Y mux 110 (decoder) is formed with two buses, each with 16 lines to select among a total of 256 bit lines 114-1 to 114-m. The bit lines 114-1 to 114-m are clustered into groups of 16 lines each. There are 16 such groups. The state machine 106 is coupled to an output of the sense amplifier circuit 130 to monitor the output of the sense amplifier circuit 130.

Figure 2:
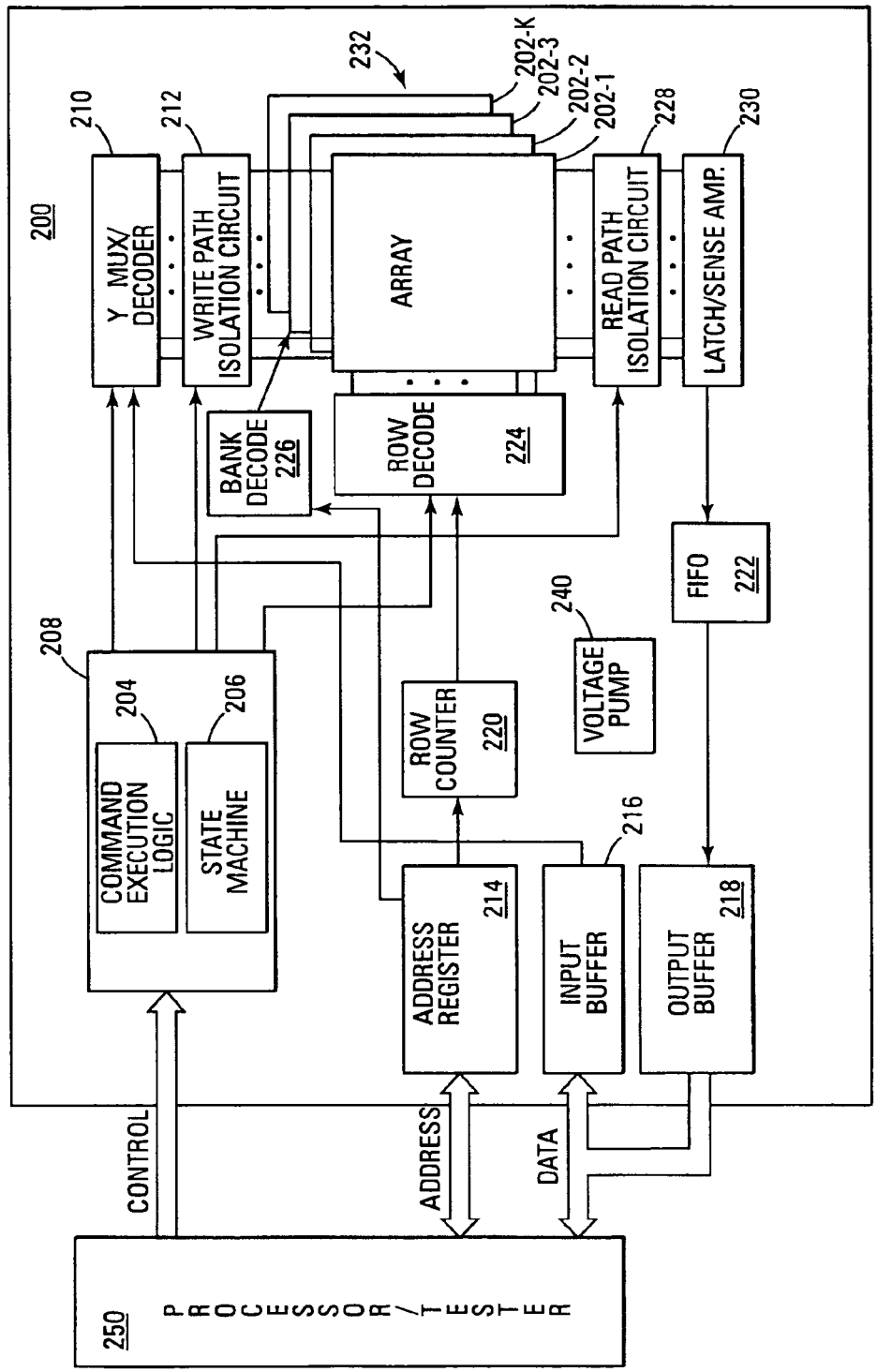
FIG. 2 is a block diagram of one embodiment of a flash memory having separate read and write paths, according to the teachings of this invention.

Referring to FIG. 2, a simplified block diagram of a synchronous flash memory 200 of an embodiment of the present invention is illustrated. The flash memory 200 is shown having control circuitry 208 to control memory operations to a memory array 232. Such memory operations include reading, writing and erasing. The control circuitry is illustrated as containing command execution logic 204 and a state machine 206. The state machine 206 is commonly referred to as the specific device that controls the memory operations. The synchronous flash memory 200 is also shown having an address register 214, a row counter 220, a row or X decode circuit 224, a bank decode 226, a voltage pump 240 and an input buffer 216. The voltage pump 240 is used to increase the voltage levels during read, write and erase operations. The X decode circuit 224 is used to decode address request to rows of memory cells in memory array 202-1 to 202-k. The bank decode 226 is used to decode address requests among the banks 202-1 to 202-k of memory in the memory array 232. Although the synchronous flash memory embodiment described has four banks of memory, it will be understood in the art that the synchronous flash memory 200 could have more than four or less than four memory banks and the present invention is not limited to four banks of memory.

The synchronous flash memory 200 of FIG. 2 is illustrated as also having a Y mux/decoder 210 and write path isolation circuit 212. The Y mux/decoder 210 is used to decode and multiplex address requests to columns of memory cells in the memory array 232. The write path isolation circuit 212 decouples the Y mux/decoder 210 from the memory array 232 during read operations. Also illustrated in FIG. 2, is a latch/sense amplifier circuit 230, a read path isolation circuit 228, a FIFO circuit 222, and an output buffer 218. The latch/sense amplifier circuit 230 is coupled to read addressed or accessed memory cells in the memory array 232. The read path isolation circuit 228 decouples the latch/sense amplifier circuit 230 from the memory array 232 during write operations. A processor 250 is shown coupled to the synchronous flash memory 200 to provide external commands, address requests and data to the synchronous flash memory 200.

Figure 3:
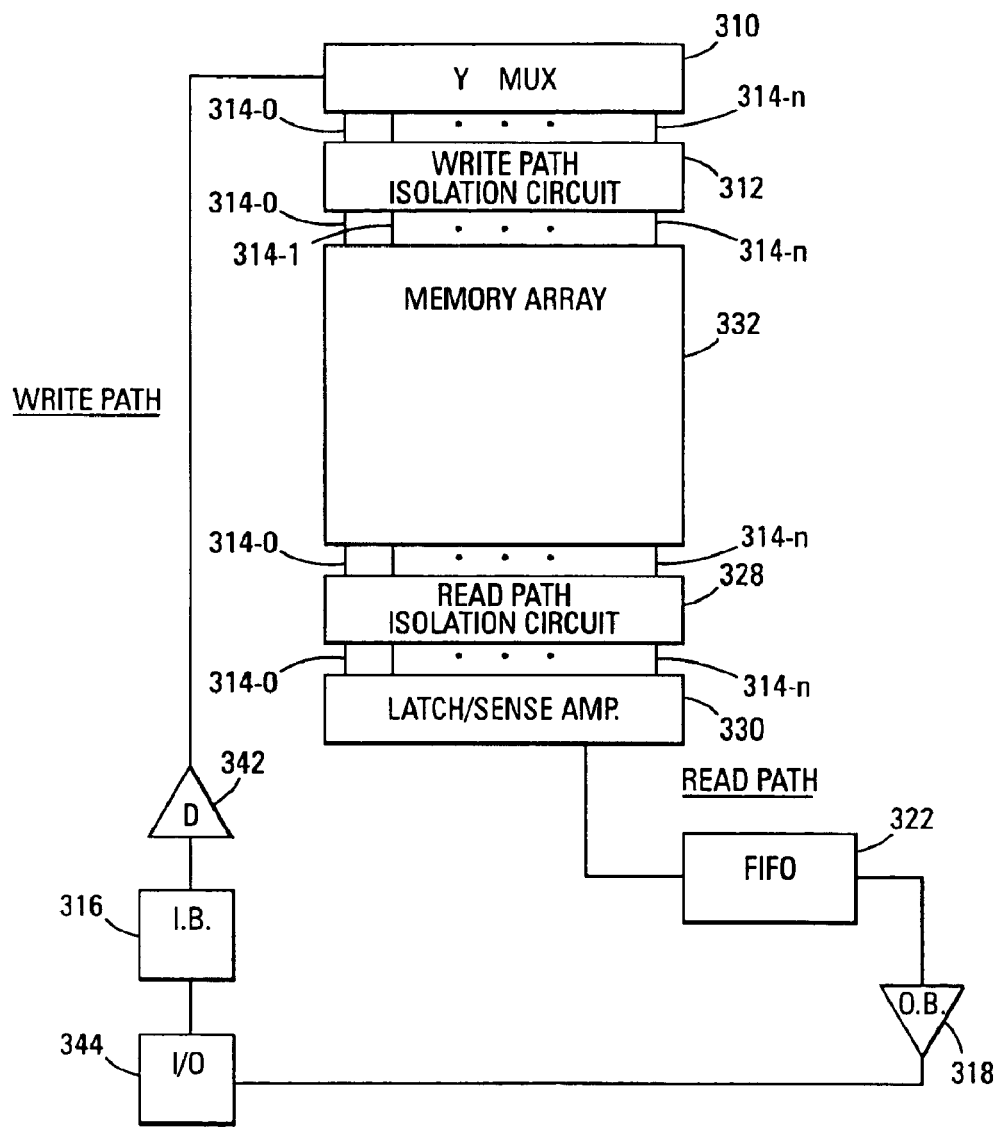
FIG. 3 is a block diagram of the read and write path of one embodiment of a flash memory, according to the teachings of this invention.

Referring to FIG. 3, a block diagram of the read and write paths of one embodiment of the present invention is illustrated. As illustrated, the write path comprises input buffer (IB) 316 coupled to an input/output connection (I/O) 344 to receive data. A driver circuit (D) 342 is coupled to the input buffer 316 to drive a program voltage (approximately 5.5 volts) when programming a cell. Y mux 310 is coupled to the driver circuit 342 to direct the program voltage to a selected bit line 314-0 to 314-n. Write path isolation circuit 312 is coupled between the Y mux 310 and memory array 332 to selectively decouple the Y mux 310 from the bit lines 314-0 to 314-n of the memory array 332 during read operations. Referring back to FIG. 2, the write path isolation circuit 212 is coupled to control circuitry 208, wherein the control circuitry 208 selectively activates the write path isolation circuit 212.

The read path of FIG. 3 includes a read path isolation circuit 328 that is coupled via bit lines 314-0 to 314-n to an end of the memory array 332 opposite the Y mux 310. Referring back to FIG. 2, the read path isolation circuit 228 is coupled to the control circuitry 208, wherein the control circuitry 208 selectively activates the read path isolation circuit 222. As illustrated in FIG. 3, a latch/sense amplifier circuit 330 is coupled to the read path isolation circuit 328 by the bit lines 314-0 to 314-n. In a read operation, a page of memory cells are read at the same time. That is, all the cells coupled to a word line are activated at the same time thereby dumping their contents into the latch/sense amplifier circuit 330 at the same time. Therefore, the latch/sense amplifier circuit 330 must contain a latch/sense amplifier for each bit line 314-0 to 314-n. FIFO circuit 322 is coupled to the latch/sense amplifier circuit 330 to control the flow of data from the latch/sense amplifier circuit 330. As shown, output buffer 318 is coupled between the FIFO circuit 322 and the input/output connection 344.

Once the cells are coupled to a word line, latch/sense amplifier circuit 330 decodes the data which can be randomly read within the page. To be able to obtain this speed, transistors within the latch/sense amplifier circuit 330 require a thin oxide layer, such as of approximately 70 Å, with short channel lengths. Therefore, the Y-mux of a typical flash memory having an oxide layer of 200 Å and a relatively long channel length will not work effectively in synchronous flash memory read paths. In effect, the present invention uses a first multiplexer 310 (the Y mux 310) in the write path and a second mux 330 (the latch/sense amplifier 330) in the read path. This allows the write path to use relatively high voltage transistors in Y mux 310 to provide the voltage needed to program cells and the read path to use higher performance lower voltage transistors in latch/sense amplifier circuit 330 in reading the cells.

Figure 4:
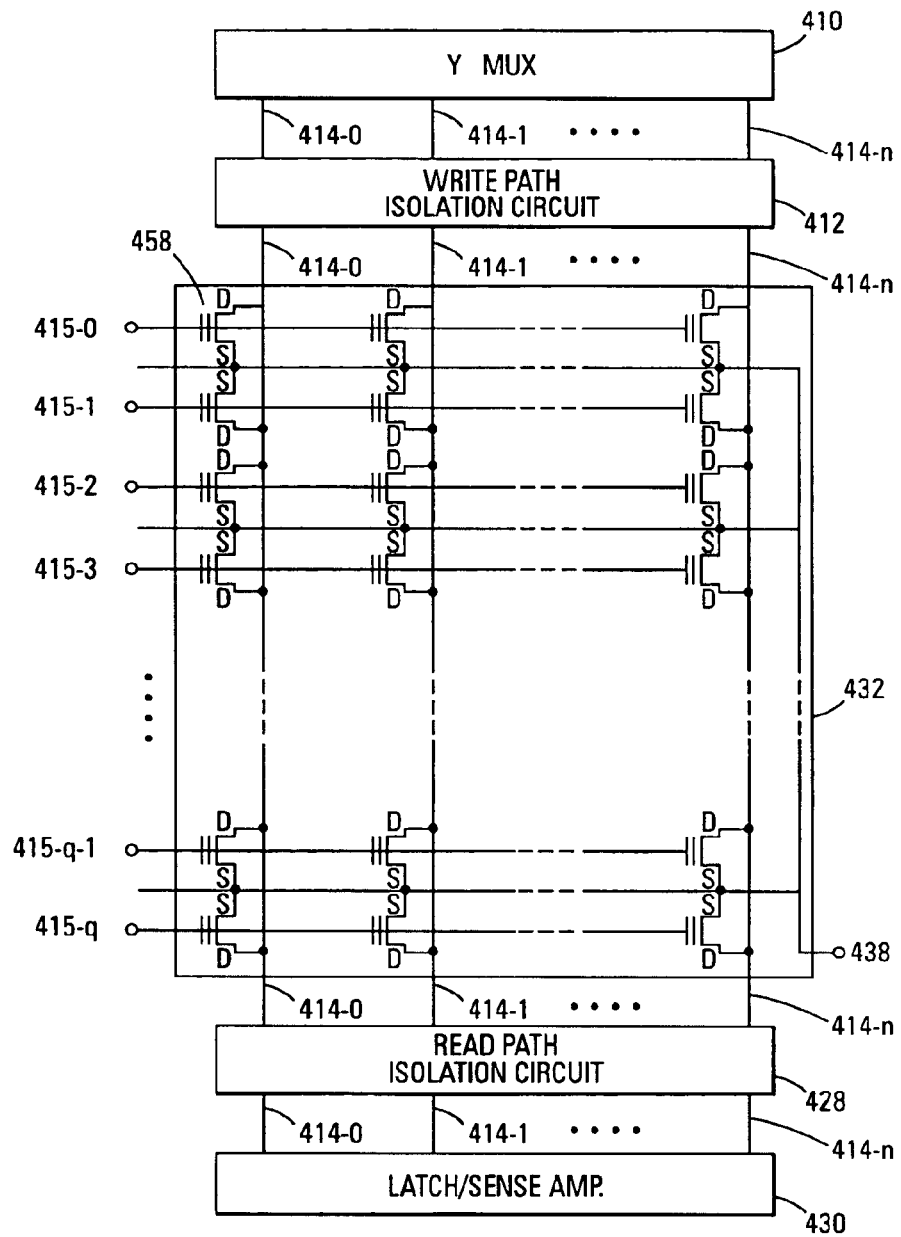
FIG. 4 is schematic-block diagram illustrating how the bit lines of a block of memory are coupled to the Y multiplexer and the latch/sense amplifier of one embodiment of a flash memory, according to the teachings of this invention.

Referring to FIG. 4, a schematic-block diagram is shown, illustrating how a first mux 410 and a second mux 430 are coupled to bit lines 414-0 to 414-n of one embodiment of the present invention. As shown, the first mux 410 (Y mux 410) is positioned at a first end of memory array 432 and coupled to a first end of bit lines 414-0 to 414-n. More specifically, write path isolation circuit 412 is coupled between the first mux 410 and the first ends of the bit lines 414-0 to 414-n. The second mux 430 (or latch/sense amplifier circuit 430) is positioned at a second end of the memory array 432 and coupled to a second end of bit lines 414-0 to 414-n. More specifically, the read path isolation circuit 428 is coupled between the second mux circuit 430 and the second ends of the bit lines 414-0 to 414-n. FIG. 4 also illustrates how cells 458 are coupled to the bit lines 414-0 to 414-n and word lines 415-0 to 415-q. Source line 438 allows a bias voltage to be applied to erase the cells.

Although FIG. 4 illustrates the first multiplexer 410 being coupled to the first end of the bit lines 414-0 to 414-n and the second multiplexer 430 being coupled to the second end of the bit lines 414-0 to 414-n, it will be understood in the art that the present invention is not limited to such. The first mux 410 and the second mux 430 may be coupled to the bit lines 414-0 to 414-n in another manner. For example, the first mux 410 and the second mux 430 may both be coupled to the same end of the bit lines 414-0 to 414-n. In addition, as understood in the art, the term mux or multiplexer as used in the present invention is also used to describe a decoder to couple selected inputs with selected outputs.

Figure 5:
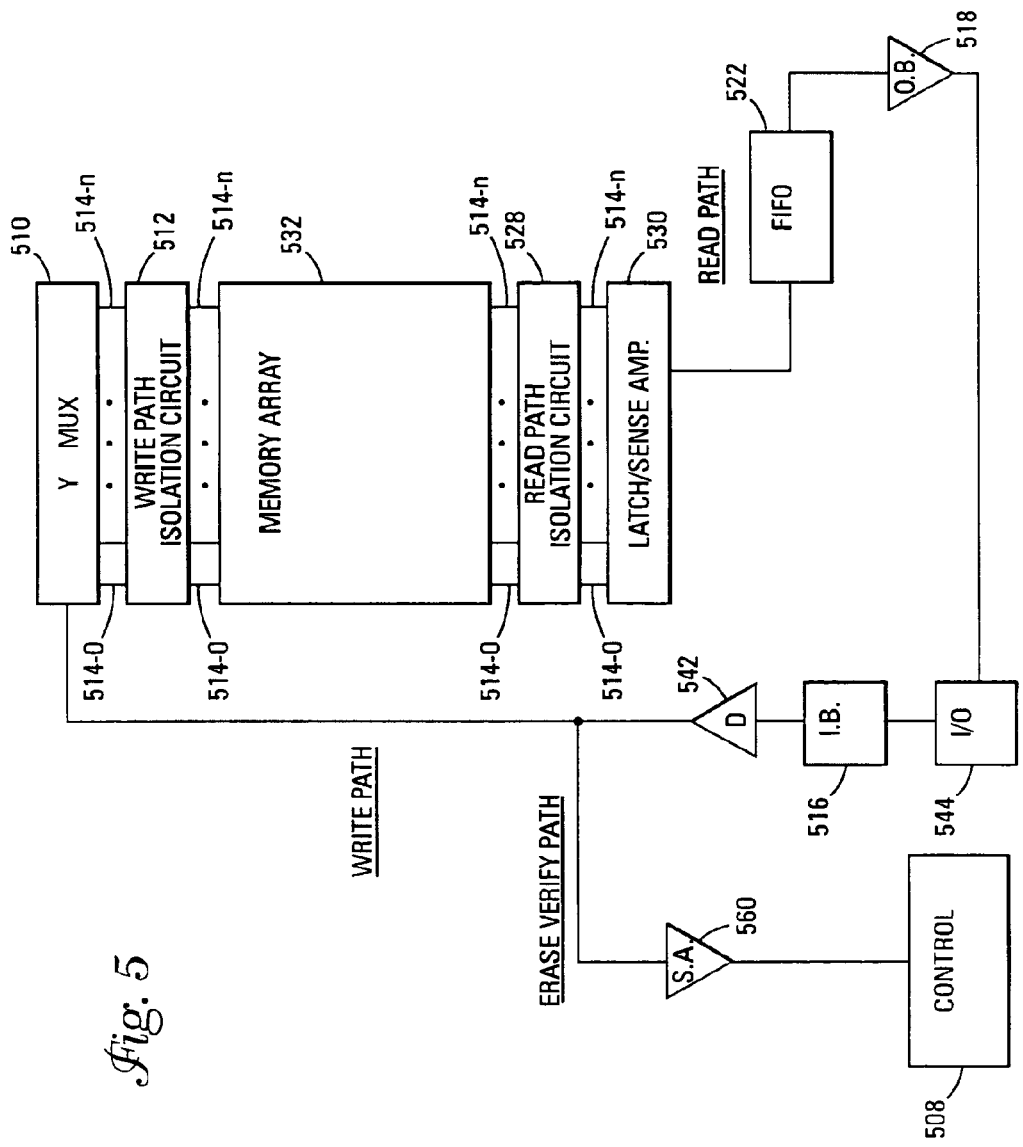
FIG. 5 is a block diagram illustrating an erase verify path of one embodiment of a flash memory, according to the teachings of this invention.

In another embodiment, an erase verify path is coupled to the write path. This embodiment is illustrated in FIG. 5. The erase verify path is used to verify that cells in a block of memory in the memory array 532 are erased after an erase pulse has been applied to the block. Since verification of the cells in a block of memory is performed on a limited number of cells, the high performance transistors of the second mux 530 (latch/sense amplifier 530) are not required. Accordingly, the first mux 510 (Y mux 510) may be used. As illustrated in FIG. 5, the erase verify path includes a sense amplifier circuit 560 to read the memory cells. Control circuitry 508 determines if another erase pulse should be applied to the block of cells being erased.

Figure 6:
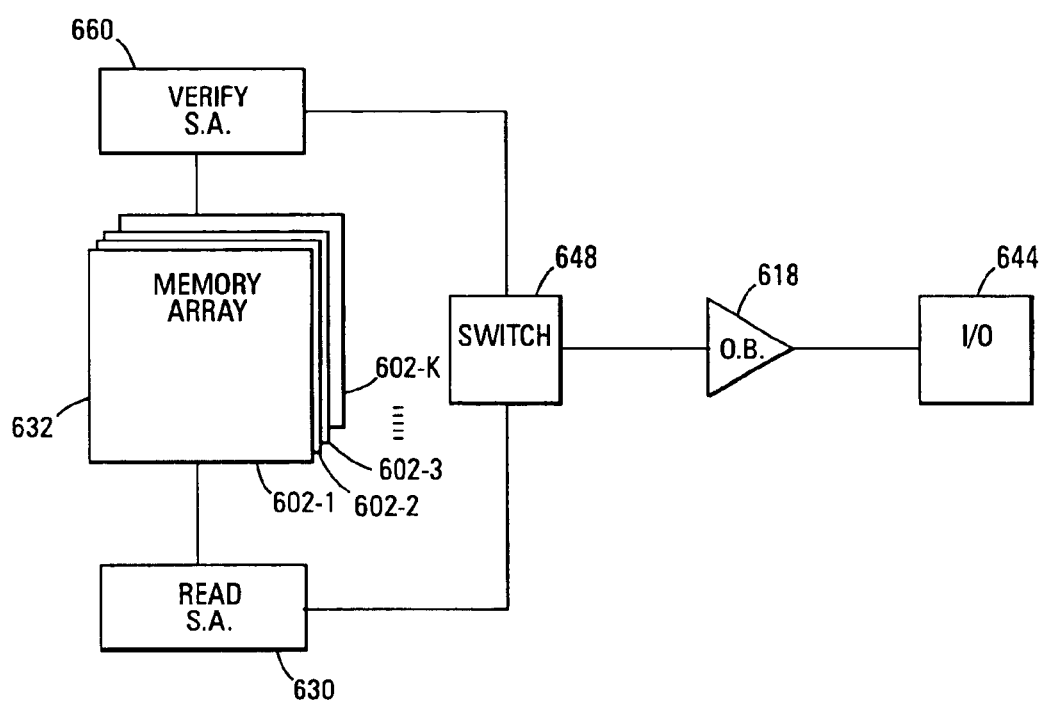
FIG. 6 is a block diagram of a system of calibrating read and write operations of one embodiment of a flash memory, according to the teachings of this invention.

Referring to FIG. 6, a block diagram illustrates a system of calibrating read and write operations of one embodiment of a flash memory. In one embodiment of the invention a distribution of voltage thresholds and timing thresholds of memory cells can be determined to properly distinguish the program states and erase states of the memory cells during read and erase operations. This improves reliability of the read and erase operations, allows for trimming of the voltage thresholds and timing thresholds of the memory cells to reduce differences of those thresholds.

A verification sense amplifier 660 is coupled to an output buffer 618 via a switch 648. A read sense amplifier 630 is also coupled to the output buffer 618 via the switch 648. The switch 648 alternates electrical connection of the output buffer 618 with the verification sense amplifier 660 and the read sense amplifier 630. The output buffer 618 is coupled to an output circuit 644.

Differences in characteristics (offsets) between read sense amplifier 630 and write sense amplifier are determined by measuring the distribution of voltage thresholds of erased cells versus voltage thresholds of programmed cells. If a bias voltage is applied to a gate of a programmed cell, the bias voltage is insufficient to overcome the threshold voltage of the programmed cell. The programmed cell will not conduct and thus be unaffected by the bias voltage. If the bias voltage is applied to an erased cell, the bias voltage overcomes the threshold voltage of the erased cell. The erased cell conducts, allowing the erased cell to be programmed. The gate bias voltage remains common for the entire array. The sense amplifier circuitry, however, may have differences in operation based on fabrication, environmental conditions, and layout. As a result, some memory cells may be read differently by the two sense amplifiers. This operation problem is mainly experienced in marginal memory cells. That is, a memory cell that is verified as being programmed may be close to an acceptable margin. When this cell is read by a different sense amplifier, the cell may read as being erased. As explained below, the sense amplifier voltages and timing can be adjusted to compensate for calibration differences.

The margin test mode of the array 632 is provided through either the verification path or the read path. This allows statistical analysis to be taken of the threshold distribution of the memory cell array array 632 using an external tester. The statistical analysis is taken of both read operations and verification operations to determine if offsets exist. If offsets are detected, decisions can be made regarding trim levels to provide proper margins for the read path verification. For example, trigger timing for the sense amplifier circuitry can be adjusted to compensate for measured offsets between the sensing circuits.

Figure 7:
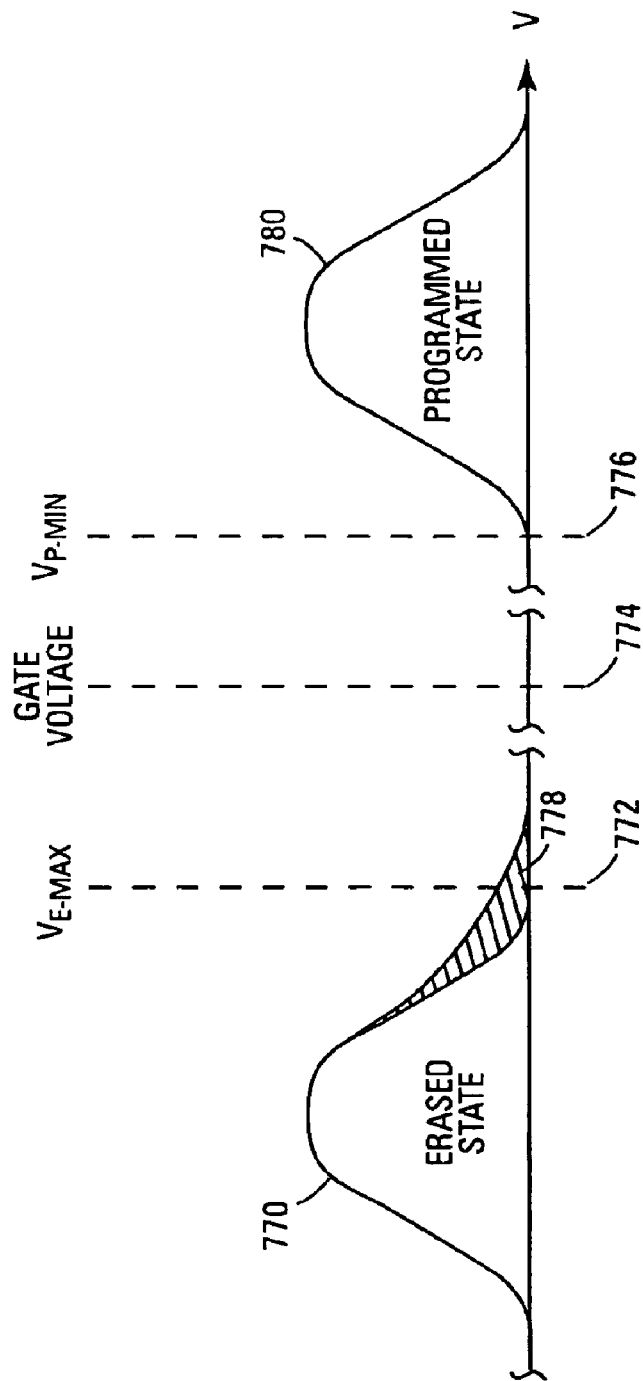
FIG. 7 is a graph illustrating a distribution of erased-state voltages and a distribution of programmed-state voltages of one embodiment of a flash memory, according to the teachings of this invention.

Referring to FIG. 7, a graph illustrates a distribution of erased-state voltages 770 and a distribution of programmed-state voltages 780 of one embodiment of a flash memory. A cell margin is a voltage differential between maximum erased state voltage 772 ($V_{E-MAX}$) and minimum programmed state voltage 776 ($V_{P-MIN}$). The cell margins can be affected by changes in bit line capacitances and cell currents due to process or layout variations, temperature, and other factors. Thus, variations in the bit line capacitances affect the charge shared voltage level, and variations in cell current affect the voltage differential that is established. As stated above, gate voltage 774 remains common for both read paths. The read paths and sensing circuitry, however, change between paths. These variables in the sensing path define $V_{E-MAX}$ 772 and $V_{P-MIN}$ 776. That is, for a given sensing circuit, a specific margin is needed to insure proper reads. When read sense amplifier 630 is used, erase distribution 770 (established with verify circuit 660) may appear as having offset 778. As such, the circuits are not calibrated. Verify circuit 660 can be adjusted so that all erased cells remain below $V_{E-MAX}$ when read using circuit 630.

Figure 8:
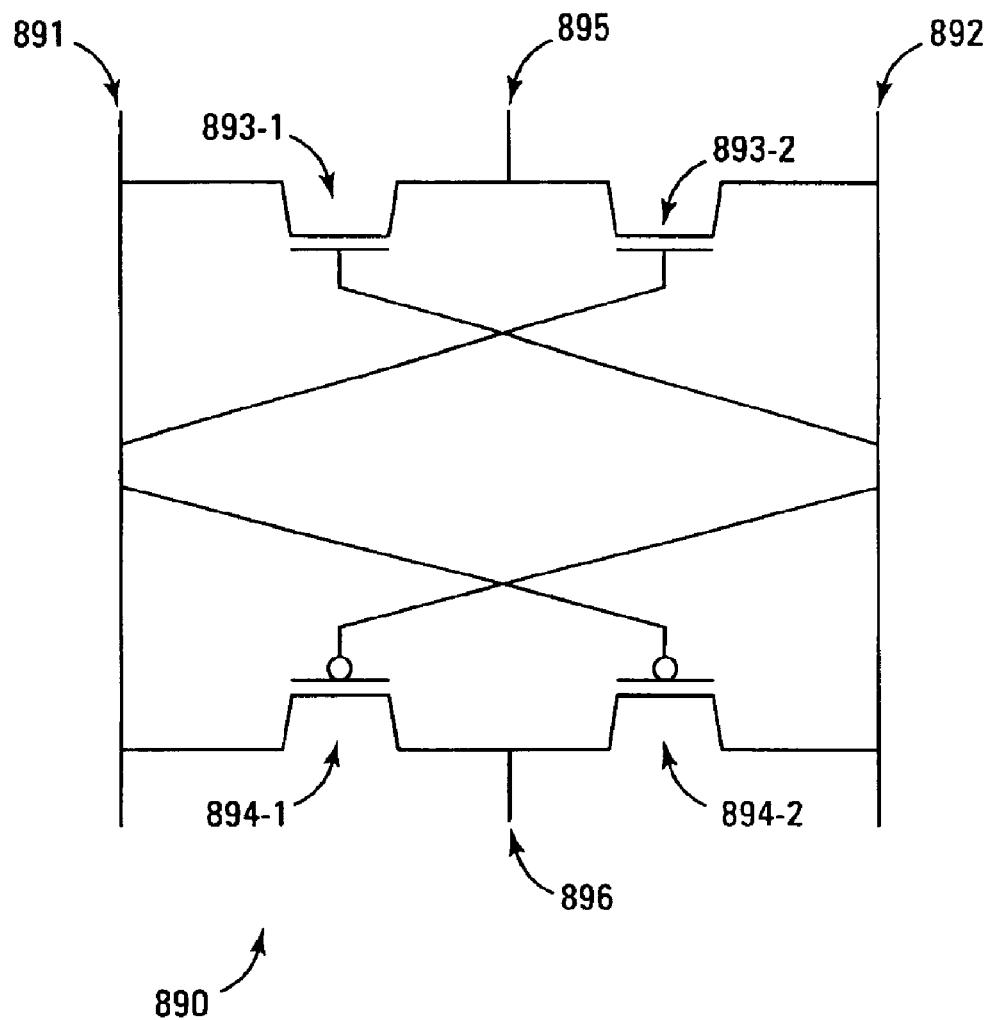
FIG. 8 is a schematic diagram illustrating an example prior art sense amplifier circuit coupled to a first bit line and a second bit line, according to the teachings of this invention.

Referring to FIG. 8, a schematic diagram is shown, illustrating an example sense amplifier circuit 890 coupled to a first bit line 891 and a second bit line 892. The sense amplifier circuit 890 includes a cross-coupled NMOS transistor pair 893-1 to 893-2, and a cross-coupled PMOS transistor pair 894-1 to 894-2. A first common node 895 is coupled to the cross-coupled NMOS transistor pair 893-1 to 893-2. A second common node 896 is coupled to the cross-coupled PMOS transistor pair 894-1 to 894-2. The first common node 895 and the second common node 896 apply adjustable trigger voltages to the cross-coupled NMOS transistor pair 893-1 to 893-2 and the cross-coupled PMOS transistor pair 894-1 to 894-2. The timing and voltage levels of nodes 895 and 896 can be modified to adjust the sensitivity of the amplifier. Implementing the sense amplifier of FIG. 8 as sense circuits 660 and 630 allows one embodiment of the present invention to be calibrated for minor offsets.

CONCLUSION

A non-volatile memory device having a method and architecture to calibrate its read and write operations has been disclosed. In one embodiment, a flash memory device has a memory array, a first multiplexer and a second multiplexer. The memory array has non-volatile memory cells arranged in columns and rows. Each memory cell in a column is coupled to an associated bit line. The first multiplexer is coupled to select bit lines during write operations to the memory array. The second multiplexer is coupled to select bit lines during read operations from the memory array. Both verify and read paths can be coupled to output circuitry to allow a statistical analysis to be performed. Offsets, therefore, can be corrected between the paths.

Although specific embodiments have been illustrated and described herein, it will be appreciated by those of ordinary skill in the art that any arrangement, which is calculated to achieve the same purpose, may be substituted for the specific embodiments shown. This application is intended to cover any adaptations or variations of the present invention.

Therefore, it is intended that this invention be limited only by the claims and the equivalents thereof.

What is claimed is:

1. A method of calibrating a non-volatile memory comprising:
   reading a data state of a plurality of memory cells with a first sense amplifier;
   reading the data state of the plurality of memory cells with a second sense amplifier;
   comparing outputs of the first and second sense amplifiers to determine offsets between the first and second sense amplifiers; and
   adjusting either the first or second sense amplifier to calibrate the first and second sense amplifiers.

2. The method of claim 1, wherein the first sense amplifier is used during erase and program operations.

3. The method of claim 1, wherein the second sense amplifier is used during read operations.

4. The method of claim 1, wherein the non-volatile memory is a flash memory.

5. The method of claim 1, wherein comparing the outputs of the first and second sense amplifiers is performed by an external test circuit.

6. The method of claim 1, wherein adjusting either the first or second sense amplifier comprises changing a voltage sensitivity of the sense amplifier.

7. A method of calibrating a non-volatile memory comprising:
   storing a test pattern in the non-volatile memory;
   reading the test pattern with a first read circuit;
   reading the test pattern with a second read circuit;
   outputting the read test pattern from the first and second read circuit to an external connection;
   determining if an offset exists between the first and second read circuits; and
   adjusting either the first or second read circuit if an offset is determined.

8. The method of claim 7, wherein determining if an offset exists between the first and second read circuits further comprises utilizing an external tester to determine if an offset exists between the first and second read circuits.

9. The method of claim 7, wherein adjusting either the first or second read circuit if an offset is determined further comprises selectively adjusting voltage levels of either the first or second read circuit if an offset is determined.

10. The method of claim 7, wherein adjusting either the first or second read circuit if an offset is determined further comprises selectively adjusting read timing of either the first or second read circuit if an offset is determined.

11. The method of claim 7, further comprising selectively adjusting a verify circuit.

12. The method of claim 7, wherein the non-volatile memory is a flash memory.

13. A system comprising:
   a memory test circuit; and
   a non-volatile memory coupled to the memory test circuit comprising,
     an array of memory cells,
     a first read path having a first read circuit,
     a second read path having a second read circuit, and
     switch circuitry, wherein the switch circuitry is adapted to select the first or second read circuits and couple to the memory test circuit via external data connections wherein the non-volatile memory further comprises a control circuit, wherein the control circuit is adapted to adjust either the first or second read circuits in response to the memory test circuit.

14. The system of claim 13, wherein the memory test circuit is adapted to determine offset between the first and second read circuits.

* * * * *